United States Patent [19]
Yen et al.

[11] Patent Number: 5,962,195
[45] Date of Patent: *Oct. 5, 1999

[54] METHOD FOR CONTROLLING LINEWIDTH BY ETCHING BOTTOM ANTI-REFLECTIVE COATING

[75] Inventors: Tzu-Shih Yen; Erik S. Jeng, both of Taipei, Taiwan

[73] Assignee: Vanguard International Semiconductor Corporation, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/926,785

[22] Filed: Sep. 10, 1997

[51] Int. Cl.$^6$ ...................................................... G03F 7/00
[52] U.S. Cl. ........................... 430/316; 430/313; 430/317; 216/41; 216/72; 438/713; 438/738
[58] Field of Search ..................................... 430/313, 316, 430/317, 318; 216/41, 72; 438/713, 738

[56] References Cited

U.S. PATENT DOCUMENTS

| | | | |
|---|---|---|---|
| Re. 30,505 | 2/1981 | Jacob ........................................ | 156/643 |
| 3,920,483 | 11/1975 | Johnson, Jr. et al. .................. | 438/514 |
| 4,253,888 | 3/1981 | Kikuchi .................................... | 430/314 |
| 5,139,904 | 8/1992 | Auda et al. .............................. | 430/313 |
| 5,308,742 | 5/1994 | Ta .............................................. | 430/313 |
| 5,326,727 | 7/1994 | Kook et al. .............................. | 437/229 |
| 5,368,989 | 11/1994 | Flaim et al. ............................. | 430/271 |
| 5,407,787 | 4/1995 | McElhanon et al. .................... | 430/315 |
| 5,656,128 | 8/1997 | Hashimoto et al. ..................... | 430/318 |
| 5,733,714 | 3/1998 | McCulloch et al. ..................... | 430/325 |
| 5,753,418 | 5/1998 | Tsai et al. ................................. | 430/313 |
| 5,773,199 | 6/1998 | Linliu et al. ............................. | 430/316 |

OTHER PUBLICATIONS

S. Wolf et al, "Silicon Processing For The VLSI Era" vol. 1, Lattice Press, Sunset Beach, CA, 1986, p. 581.

*Primary Examiner*—Janet Baxter
*Assistant Examiner*—Jill N. Holloman
*Attorney, Agent, or Firm*—George O. Saile; Stephen B. Ackerman; Alek P. Szecsy

[57] ABSTRACT

A method for forming a patterned target layer within an integrated circuit. The method employs a plasma pre-treatment of a patterned photoresist layer employed in patterning a blanket focusing which in turn is employed in patterning the patterned target layer from a blanket target layer. The plasma pre-treatment employs a plasma pre-treatment composition comprising carbon tetrafluoride and argon without oxygen. After the plasma pre-treatment, the blanket focusing layer is etched with a reproducible negative etch bias in a plasma etch method employing an etchant gas composition comprising carbon tetrafluoride and argon without oxygen. Through the method there may be formed patterned target layers, with enhanced uniformity, of linewidth dimension as narrow as about of 0.25 microns while employing near ultra-violet (NUV) (ie: 365 nm) photoexposure methods.

18 Claims, 4 Drawing Sheets

METHOD FOR CONTROLLING LINEWIDTH BY ETCHING BOTTOM ANTI-REFLECTIVE COATING

BACKGROUND OF THE INVENTION

1. Field of the Invention

The present invention relates generally to methods for forming patterned layers within integrated circuits. More particularly, the present invention relates to methods for forming within integrated circuits patterned layers of linewidth at least as narrow as about 0.25 microns while employing i-line (ie: 365 nm) photoexposure radiation.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

As integrated circuit technology has advanced, there has been a continuing and correlating trend towards decreasing linewidth dimensions of electrical circuit elements and patterned layers through which are formed those advanced integrated circuits. The decreasing linewidth dimensions have typically traditionally been effected principally through decreasing the wavelength of photoexposure radiation employed in forming patterned photoresist layers which are employed in defining the linewidth dimensions of those electrical circuit elements and patterned layers. Currently, photoexposure radiation is typically in the near ultra-violet (NUV) (ie: 365 nm) wavelength region for forming electrical circuit elements and patterned layers of linewidth dimension typically as low as about 0.30 micron, while the most advanced photoexposure tooling typically employs a photoexposure radiation in the deep ultra-violet (DUV) (ie: 248 nm) wavelength region or x-ray wavelength region for forming electrical circuit elements and patterned layers of linewidth dimensions in the deep sub-micron region as low as about 0.10 micron.

While the trend towards decreasing wavelength of photoexposure radiation as a means for providing electrical circuit elements and patterned layers of decreased linewidth dimensions within advanced integrated circuits will most certainly continue, it nonetheless becomes important to provide methods and materials through which the evolution from the current generations of integrated circuits having formed therein electrical circuit elements and patterned layers defined by photoexposure tooling employing a near ultra-violet (NUV) (ie: 365 nm) photoexposure radiation wavelength to future generations of integrated circuits having formed therein electrical circuit elements and patterned layers defined by advanced generations of photoexposure tooling employing a deep ultra-violet (DUV) (ie: 248 nm) or x-ray photoexposure radiation wavelength may be smoothly facilitated. In that regard, it is typically desirable to characterize to the extent possible, through relevant research and development activities, advanced electrical circuit elements and patterned layers of decreased linewidth dimensions at the earliest possible opportunity prior to committing production of integrated circuits having formed therein those advanced electrical circuit elements and patterned layers of decreased linewidth dimensions to advanced photoexposure tooling. Among other advantages, such pre-production characterization allows for efficient use of advanced photoexposure tooling when initiating production of the advanced integrated circuits within a manufacturing environment. In particular, within advanced integrated circuits having formed therein advanced field effect transistors (FETs) defined by gate electrodes of diminished linewidth dimensions, it is typically desirable to fully characterize those advanced field effect transistors (FETs) prior to production of those advanced field effect transistors (FETs) since the gate electrode linewidth within a field effect transistor (FET) defines the channel width within the field effect transistor (FET) which in part defines the operational characteristics of the field effect transistor (FET). It is thus towards providing a method for forming within advanced integrated circuits advanced electrical circuit elements and patterned layers having decreased linewidth dimensions without the need for employing advanced photoexposure tooling in forming those advanced electrical circuit elements and patterned layers that the present invention is generally directed.

Plasma etch methods and materials which may be employed in forming within integrated circuits patterned layers, such as patterned polysilicon or polycide gate electrodes within field effect transistors (FETs), are known in the art of integrated circuit fabrication. For example, plasma etchant gases appropriate for etching layers formed of various materials within integrated circuits are in general disclosed by S. Wolf et al. in Silicon Processing for the VLSI Era, Vol. 1: Process Technology, Lattice Press (Sunset Beach, Calif.; 1968), pg. 581. In addition, Jacob, in U.S. Pat. No. Re. 30,505 discloses, for the etching of integrated circuit layers including insulator layers and several metal layers, several specific reactive ion etch (RE) etchant gas compositions employing binary mixtures of oxygen and halocarbons of no greater than two carbon atoms, where at least one of the carbon atoms is linked to a predominance of fluorine atoms. Further, Kook et al., in U.S. Pat. No. 5,326,727 discloses a specific method and materials for limiting etch bias during plasma etching when forming patterned layers within integrated circuits. The method employs an organic planarizing layer and a plasma etchant gas composition comprising oxygen and a halogen or halogen hydride. Analogously, Ta et al., in U.S. Pat. No. 5,308,742 disclose another plasma etch method and materials for limiting etch bias during plasma etching when forming patterned layers within integrated circuits. The method employs an organic anti-reflective coating (ARC) layer and a plasma etchant gas composition comprising trifluoromethane, oxygen and argon. Finally, various types of anti-reflective coating (ARC) layer compositions are in general disclosed Flaim et al., in U.S. Pat. No. 5,368,989, the teachings of which are incorporated herein fully by reference.

Most pertinent to the present invention, however, is the disclosure within a related co-assigned application similarly entitled "Method for Controlling Linewidth by Etching Bottom Anti-Reflective Coating," application Ser. No. 08/711,142, filed Sep. 9, 1996, now U.S. Pat. No. 5,773,199, which describes a plasma etch method employing a focusing layer formed from an organic anti-reflective coating (ARC) material and a plasma etchant gas composition comprising trifluoromethane, carbon tetrafluoride, oxygen and argon. Through the plasma etch method there may be formed within integrated circuits patterned layers of linewidth dimensions at least as narrow as about 0.25 microns while employing near ultra-violet (NUV) (ie: 365 nm) photoexposure radiation. While the method and materials as disclosed within application Ser. No. 08/711,142 provide within integrated circuits patterned layers of linewidth dimension at least as narrow as about 0.25 microns, the method is not entirely without problems. In particular, within the method as disclosed within application Ser. No. 08/1711,142 there is typically observed: (1) a substantial variation in linewidth dimensions of patterned layers formed through the method; and (2) an elevated level of particulate contamination formed upon patterned layers formed through the method. It is towards addressing at least one of these two problems that the present invention is directed.

Thus, desirable in the art are additional methods and materials through which linewidth dimensions of electrical circuit elements and patterned layers within advanced integrated circuits may be controlled. Particularly desirable are methods and materials through which linewidth dimensions of electrical circuit elements and patterned layers within advanced integrated circuits may be controlled to provide electrical circuit elements and patterned layers of linewidth dimension at least as narrow as about 0.25 microns while employing near ultra-violet (NUV) (ie: 365 nm) photoexposure radiation. More particularly desirable are additional methods and materials through which advanced field effect transistors (FETs) having gate electrodes of linewidth dimension at least as narrow as about 0.25 microns may be formed within advanced integrated circuits while employing near ultra-violet (NUV) (ie: 365 nm) photoexposure radiation. Most particularly desirable are methods and materials which fulfill the foregoing criteria while providing patterned layers of uniform linewidth dimensions and/or minimal particulate contamination. It is towards these goals that the present invention is specifically directed.

SUMMARY OF THE INVENTION

A first object of the present invention is to provide a method for forming for use within advanced integrated circuits electrical circuit elements and patterned layers of linewidth dimensions at least as low as about 0.25 microns.

A second object of the present invention is to provide a method in accord with the first object of the present invention, where the electrical circuit elements and patterned layers are formed employing near ultra-violet (NUV) (ie: 365 nm) photoexposure radiation.

A third object of the present invention is to provide a method in accord with the first object of the present invention and the second object of the present invention, where the patterned layer so formed has a uniform linewidth dimension or minimal particulate contamination.

A fourth object of the present invention is to provide a method in accord with the first object of the present invention, the second object of the present invention or the third object of the present invention, which method is readily manufacturable.

In accord with the objects of the present invention, there is provided by the present invention a method for forming for use within an advanced integrated circuit a patterned layer. To practice the method of the present invention, there is first provided a substrate having formed thereover a blanket target layer. There is then formed upon the blanket target layer a blanket focusing layer formed from an organic anti-reflective coating (ARC) material, where the blanket focusing layer is susceptible to a reproducible negative etch bias within a first etch method employed in forming from the blanket focusing layer a patterned focusing layer. The first etch method is a first plasma etch method employing an etchant gas composition comprising carbon tetrafluoride and argon without oxygen. There is then formed upon the blanket focusing layer a blanket photoresist layer which is photoexposed and developed to form a patterned photoresist layer. The patterned photoresist layer is then pre-treated and stabilized through a plasma pre-treatment method to form a pre-treated patterned photoresist layer. The plasma pre-treatment method employs a plasma pre-treatment gas composition comprising carbon tetrafluoride and argon without oxygen. There is then etched through the first etch method the blanket focusing layer to form the patterned focusing layer while employing the pre-treated patterned photoresist layer as a first etch mask layer. The patterned focusing layer so formed has the reproducible etch bias with respect to the patterned photoresist layer. Finally, there is etched through a second etch method the blanket target layer to form a patterned target layer while employing the patterned focusing layer as a second etch mask layer. The patterned target layer has a reproducible second etch bias with respect to the patterned focusing layer, where the reproducible second etch bias does not substantially compensate the reproducible negative etch bias. To provide optimal resolution and minimal linewidth, there may optionally be employed within the method of the present invention a blanket conformal dielectric layer between the blanket focusing layer and the blanket target layer, where the blanket conformal dielectric layer is patterned to form a patterned conformal dielectric layer through an etch method intermediate to the first etch method and the second etch method.

When: (1) the blanket photoresist layer is photoexposed through a near ultra-violet (NUV) (ie: 365 nm) photoexposure radiation method and developed to yield a patterned photoresist layer of linewidth dimension about 0.40 microns; and (2) the reproducible negative etch bias of the patterned focusing layer with respect to the patterned photoresist layer is at least about −0.15 microns, a patterned target layer, such a gate electrode within a field effect transistor (FET), of linewidth dimension at least as narrow as about 0.25 microns may be obtained through the method of the present invention.

Through the method of the present invention there may be formed for use within advanced integrated circuits electrical circuit elements and patterned layers of linewidth dimension at least as narrow as about 0.25 microns while employing near ultra-violet (NUV) (ie: 365 nm) photoexposure radiation. By employing: (1) a blanket focusing layer formed of an organic anti-reflective coating material through which there is formed a patterned focusing layer having a reproducible negative etch bias with respect to a patterned photoresist layer which is employed as a first etch mask layer in patterning the patterned focusing layer from the blanket focusing layer; and (2) a blanket photoresist layer which may be photoexposed through a near ultra-violet (NUV) (ie: 365 nm) photoexposure radiation method and developed to yield a patterned photoresist layer of linewidth dimension about 0.40 microns, there may be formed a patterned target layer, such as a gate electrode within a field effect transistor (FET). When the reproducible negative etch bias is: (1) not otherwise compensated; and (2) at least about −0.15 microns, the patterned target layer, such as the gate electrode within the field effect transistor (FET) may be formed with a linewidth at least as narrow as about 0.25 microns.

Through the method of the present invention there may be formed within integrated circuits patterned layers of uniform linewidth dimensions, possibly with minimal particulate contamination. While the mechanism through which the plasma pre-treatment and stabilizing process step of the method of the present invention operates to provide a pre-treated patterned photoresist layer which in turn defines a patterned focusing layer through which there is in turn formed a patterned layer of uniform linewidth dimension, possibly with minimal particulate contamination, is not entirely well understood, it is nonetheless clear that when employing the plasma pre-treatment and stabilizing process step of the method of the present invention there is formed a pre-treated patterned photoresist layer through which there is ultimately formed a patterned layer of uniform linewidth dimension, possibly with minimal particulate contamination.

The method of the present invention is readily manufacturable. As is disclosed within the preferred embodiment of the method of the present invention, which is directed towards forming within a field effect transistor (FET) for use within an integrated circuit a polysilicon or polycide gate electrode of linewidth dimension at least as narrow as about 0.25 microns while employing a near ultra-violet (NUV) (ie: 365 nm) photoexposure radiation method, the method of the present invention may be practiced through methods and materials as are generally known in the art of integrated circuit fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
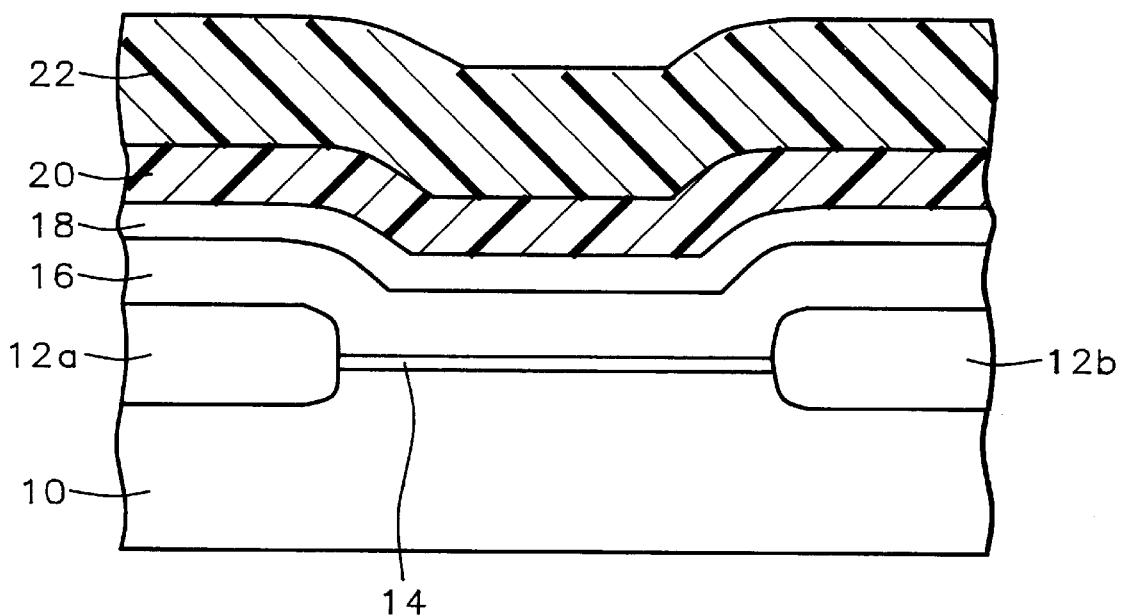
FIG. 1 to FIG. 7 show a series of schematic cross-sectional diagrams illustrating the results of progressive stages in forming within a field effect transistor (FET) for use within an integrated circuit a gate electrode of linewidth dimension at least as narrow as about 0.25 microns while employing a near ultra-violet (NUV) (ie: 365 nm) photoexposure radiation method through the preferred embodiment of the method of the present invention.

The present invention provides a method for forming for use within an integrated circuit a patterned layer, where the patterned layer may be formed of a uniform linewidth dimension at least as narrow as about 0.25 microns, possibly with minimal particulate contamination, while employing a near ultra-violet (NUV) (ie: 365 mn) photoexposure radiation method. The method of the present invention achieves this goal by employing a blanket focusing layer formed beneath a patterned photoresist layer employed in defining the patterned layer from a blanket layer, where a patterned focusing layer formed from the blanket focusing layer is susceptible to a reproducible negative etch bias with respect to the patterned photoresist layer when etching through a first etch method, while employing the patterned photoresist layer as a first etch mask layer, the patterned focusing layer from the blanket focusing layer. Within the method of the present invention, the blanket focusing layer is formed from an organic anti-reflective coating (ARC) material, and the first etch method is a first plasma etch method employing a reactant gas composition comprising carbon tetrafluoride and argon without oxygen. Prior to forming the patterned focusing layer from the blanket focusing layer, the patterned photoresist layer is pre-treated and stabilized within a plasma pre-treatment method employing a plasma pre-treatment gas composition comprising carbon tetrafluoride and argon without oxygen. The patterned focusing layer having the reproducible negative or positive etch bias is then employed as a second etch mask layer in a second etch method when forming the patterned layer from the blanket layer. Thus, when the patterned photoresist layer has been formed through a near ultra-violet (NUV) (ie: 365 nm) photoexposure radiation method to yield a patterned photoresist layer of linewidth dimension about 0.40 microns, and the reproducible negative etch bias of the patterned focusing layer with respect to the patterned photoresist layer is at least about −0.15 microns, the patterned layer may be formed with a linewidth dimension at least as narrow as about 0.25 microns while employing the near ultra-violet (NUV) (ie: 365 nm) photoexposure radiation method, provided that the second etch method does not exhibit a reproducible second etch bias which substantially compensates the reproducible negative etch bias within the first etch method.

The method of the present invention may be employed in forming electrical circuit elements and patterned layers within integrated circuits including but not limited to dynamic random access memory (DRAM integrated circuits, static random access memory (SRAM) integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors.

Although the preferred embodiment of the method of the present invention discloses the method of the present invention as employed in forming a polysilicon or polycide gate electrode within a field effect transistor (FET) for use within an integrated circuit, it is understood by a person skilled in the art that the method of the present invention may also be employed in forming any of several other patterned target layers from blanket target layers for use within an integrated circuit. In that regard, the method of the present invention may be employed in forming patterned target layers from blanket target layers including but not limited to blanket conductor layers, blanket insulator layers, blanket semiconductor layers and blanket photoactive layers. Typically, although not exclusively, the blanket target layer from which is formed the patterned target layer through the method of the present invention will have a thickness of from about 1000 to about 20000 angstroms.

Referring now to FIG. 1 to FIG. 7, there is shown a series of schematic cross-sectional diagrams illustrating the results of progressive stages in forming within a field effect transistor (FET) for use within an integrated circuit a gate electrode through the preferred embodiment of the method of the present invention. Shown in FIG. 1 is a schematic cross-sectional diagram of the integrated circuit at its early stages of fabrication.

Shown in FIG. 1 is a semiconductor substrate 10 within and upon whose surface is formed a pair of isolation regions 12a and 12b which define the active region of the semiconductor substrate 10. Although semiconductor substrates are known in the art with either dopant polarity, various dopant concentrations and several crystallographic orientations, for the preferred embodiment of the method of the present invention, the semiconductor substrate 10 is preferably formed from a (100) silicon semiconductor substrate having a N− or P− doping. Similarly, although it is also known in the art that isolation regions may be formed within and/or upon semiconductor substrates to define active regions of those semiconductor substrates through several methods, including but not limited to isolation region growth methods and isolation region deposition/patterning methods, for the preferred embodiment of the method of the present invention, the isolation regions 12a and 12b are preferably formed within and upon the semiconductor substrate 10 through an isolation region growth method through which isolation regions 12a and 12b of silicon oxide are formed within and upon the semiconductor substrate 10.

Also shown in FIG. 1 is the presence of five blanket layers which are formed upon or over the active region of the semiconductor substrate 10 and/or the isolation regions 12a and 12b which define the active region of the semiconductor substrate 10. The five layers are: (1) a blanket gate dielectric layer 14 formed upon the active region of the semiconductor substrate 10; (2) a blanket gate electrode material layer 16 formed upon the blanket gate dielectric layer 14 and the isolation regions 12a and 12b; (3) a blanket conformal dielectric layer 18 formed upon the blanket gate electrode material layer 16; (4) a blanket focusing layer 20 formed upon the blanket gate electrode material layer 18; and (5) a blanket photoresist layer 22 formed upon the blanket focusing layer 20. Of these five blanket layers, the blanket gate dielectric layer 14, the blanket gate electrode material layer 16 and the blanket conformal dielectric layer 18 may be formed through methods and materials as are otherwise conventional in the art of integrated circuit fabrication.

For example, blanket gate dielectric layers may be formed within integrated circuits through methods including but not limited to blanket gate dielectric layer growth methods and blanket gate dielectric layer deposition methods through which may be formed blanket gate dielectric layers typically formed of silicon oxide. In addition, blanket gate electrode material layers may be formed within integrated circuits through methods including but not limited to thermally assisted evaporation methods, chemical vapor deposition (CVD) methods and physical vapor deposition (PVD) sputtering methods through which may be formed blanket gate electrode material layers formed from gate electrode materials including but not limited to metals, metal alloys, highly doped polysilicon and polycides (ie: highly doped polysilicon/metal silicide stacks). Finally, blanket conformal dielectric layers may be formed within integrated circuits through methods including but not limited to chemical vapor deposition (CVD) methods, plasma enhanced chemical vapor deposition (PECVD) methods and physical vapor deposition (PVD) sputtering methods through which may be formed blanket conformal dielectric layers of dielectric materials including but not limited to silicon oxide dielectric materials, silicon nitride dielectric materials and silicon oxynitride dielectric materials.

For the preferred embodiment of the method of the present invention, the blanket gate dielectric layer 14 is preferably formed upon the active region of the semiconductor substrate 10 through a thermal oxidation method at a temperature of from about 750 to about 950 degrees centigrade, through which a portion of the active region of the semiconductor substrate 10 is consumed in forming the blanket gate dielectric layer 14 of silicon oxide. Typically, the blanket gate dielectric layer 14 of silicon oxide so formed is from about 40 to about 140 angstroms in thickness. In addition, for the preferred embodiment of the method of the present invention, the blanket gate electrode material layer 16 is preferably formed upon the blanket gate dielectric layer 14 and the isolation regions 12a and 12b through appropriate chemical vapor deposition (CVD) methods and physical vapor deposition (PVD) sputtering methods through which is formed a blanket gate electrode material layer 16 formed of highly doped polysilicon or a polycide (ie: highly doped polysilicon/metal silicide stack). Preferably, the blanket gate electrode material layer 16 so formed is from about 1000 to about 3000 angstroms in thickness. Finally, for the preferred embodiment of the method of the present invention, the blanket conformal dielectric layer 18 is preferably formed upon the blanket gate electrode material layer 16 of a silicon oxide dielectric material formed through a plasma enhanced chemical vapor deposition (PECVD) method or a low pressure chemical vapor deposition (LPCVD) method, while employing tetra-ethyl-ortho-silicate (TEOS) as a silicon source material. Preferably, the blanket conformal dielectric layer 18 so formed is from about 300 to about 2500 angstroms in thickness.

With respect to the blanket focusing layer 20, the blanket focusing layer 20 is formed from an organic anti-reflective coating (ARC) material which exhibits a negative etch bias in a first etch method with respect to a patterned photoresist layer which serves as a first etch mask layer in etching a patterned focusing layer from the blanket focusing layer 20. The first etch method is a first plasma etch method employing a reactant gas composition comprising carbon tetrafluoride and argon without oxygen. While a specific example of an operable organic anti-reflective coating (ARC) material is disclosed below within the EXAMPLES, organic anti-reflective coating (ARC) materials are generally known in the art to be formed from any of several organic polymer materials which intrinsically or extrinsically incorporate dye chromophores tuned to a particular wavelength of light whose reflectance is desired to be attenuated. Layers of such anti-reflective coating (ARC) materials are typically formed upon semiconductor substrates through spin coating of organic solvent solutions comprising the dye chromophores and the polymer materials, as well as other additives, followed by thermal evaporation of the solvent. See, for example, Flaim et al., U.S. Pat. No. 5,368,989. Preferably, the blanket focusing layer 20 formed of the organic anti-reflective coating (ARC) material is formed to a thickness of from about 750 to about 2500 angstroms.

Finally, although the blanket photoresist layer 22 may in general be formed of any of several photoresist materials, including but not limited to positive photoresist materials, negative photoresist materials, novolak photoresist materials and poly-methyl-meth-acrylate (PMMA) photoresist materials, for the preferred embodiment of the method of the present invention, the blanket photoresist layer 22 is preferably formed from a photoresist material which will not substantially impede forming a patterned focusing layer from the blanket focusing layer 20, where the patterned focusing layer has a reproducible negative etch bias with respect to a patterned photoresist layer formed from the blanket photoresist layer 22. Thus, with respect to the preferred embodiment of the method of the present invention, it has also been determined experimentally that the blanket photoresist layer 22 is preferably formed of a positive novolak photoresist material since positive novolak photoresist materials provide the foregoing characteristics while simultaneously being readily patterned employing a near ultra-violet (NUV) (ie: 365 nm) photoexposure radiation method. Preferably, the blanket photoresist layer 22 so formed is from about 5000 to about 25000 angstroms thick.

Figure 2:
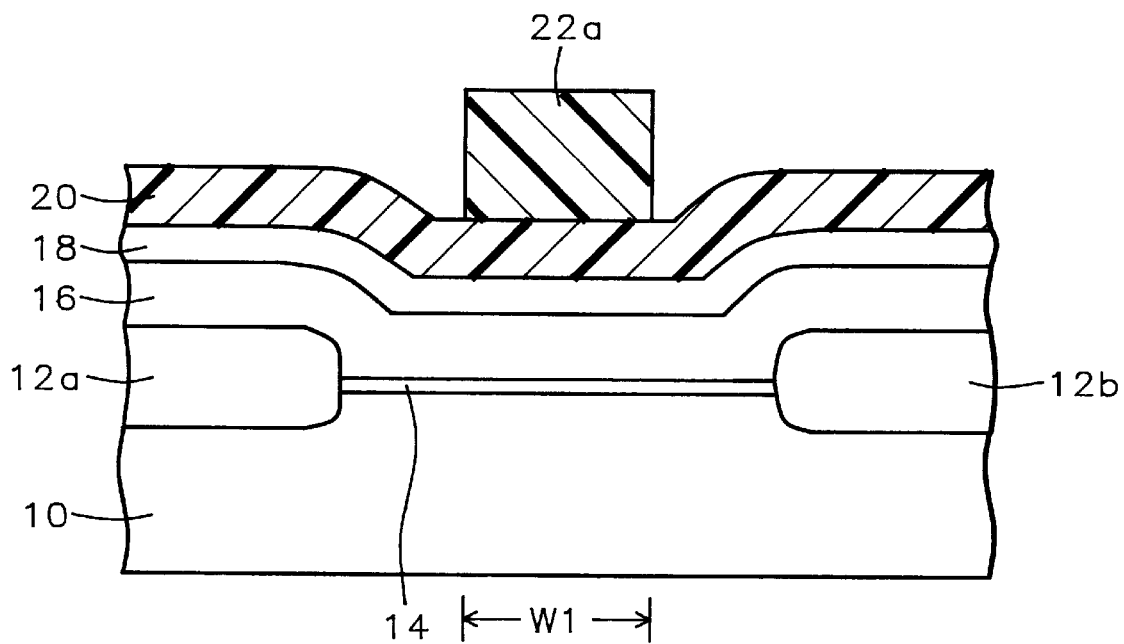

Referring now to FIG. 2, there is shown a schematic cross-sectional diagram illustrating the results of further processing of the integrated circuit whose schematic cross-sectional diagram is illustrated in FIG. 1. Shown in FIG. 2 is the results of: (1) photoexposing through a method employing near ultra-violet (NUV) (ie: 365 nm) photoexposure radiation; and (2) developing through methods as are conventional in the art, the blanket photoresist layer 22 to form a patterned photoresist layer 22a. As is illustrated in FIG. 2, the blanket photoresist layer 22 is photoexposed and developed to form the patterned photoresist layer 22a of a linewidth W1 upon the blanket focusing layer 20. When employing a near ultra-violet (NUV) (ie: 365 nm) photoexposure radiation method and subsequent development through methods as are conventional in the art, the patterned photoresist layer 20a is typically reproducibly formed with adequate resolution at a linewidth W1 no smaller than about 0.35 microns.

Figure 3:
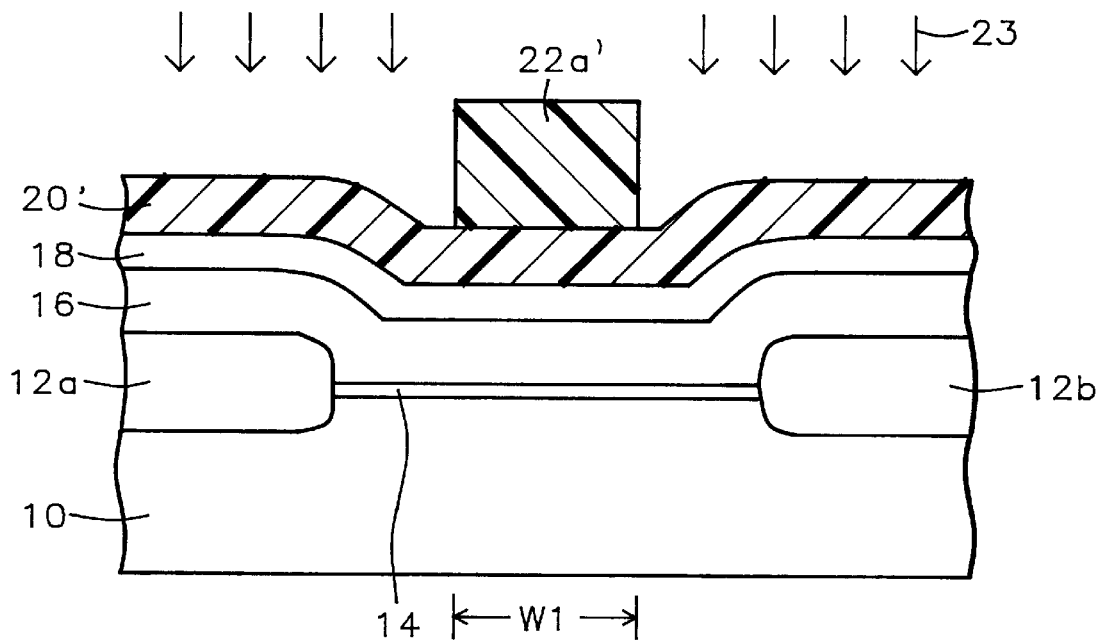

Referring now to FIG. 3, there is shown a schematic cross-sectional diagram illustrating the results of further processing of the integrated circuit whose schematic cross-sectional diagram is illustrated in FIG. 2. Shown in FIG. 3 is a schematic cross-sectional diagram of an integrated circuit otherwise equivalent to the schematic cross-sectional diagram of the integrated circuit whose schematic cross-sectional diagram is illustrated in FIG. 2, but within which the patterned photoresist layer 22a and exposed portions of the blanket focusing layer 20 have been pre-treated and stabilized within a plasma pre-treatment method employing a pre-treatment plasma 23 to form a pre-treated patterned photoresist layer 22a' and a pre-treated blanket focusing layer 20'. The pre-treatment plasma 23 provides a pre-treated patterned photoresist layer 22a' and a pre-treated blanket focusing layer 20' from which there may ultimately be formed a gate electrode of uniform linewidth dimensions, possibly with minimal particulate contamination. As is illustrated in FIG. 3, the pre-treatment plasma 23 does not appreciably affect the linewidth W1 of the patterned photoresist layer 22a when forming the pre-treated patterend photoresist layer 22a'.

While the mechanism through which the pre-treatment plasma 23 assists within the preferred embodiment of the method of the present invention in ultimately forming from blanket layers formed beneath the pre-treated patterned photoresist layer 22a' a gate electrode of uniform linewidth dimensions is not entirely clear, it is believed that the pre-treatment plasma 23 assists in eliminating from the patterned photoresist layer 22a any of several patterned photoresist layer 22a inhomogeneities, such as but not limited to a patterned photoresist layer 22a footing extension inhomogeniety at the interface of the patterned photoresist layer 22a with the blanket focusing layer 20, while not substantially affecting the linewidth W1 of the patterned photoresist layer 22a when forming the pre-treated patterend photoresist layer 22a'.

Within the preferred embodiment of the method of the present invention the pre-treatment plasma 23 employs a plasma pre-treatment gas composition preferably comprising carbon tetrafluoride and argon without oxygen. More preferably, the pre-treatment plasma 23 employs a plasma pre-treatment gas composition consisting of carbon tetrafluoride and argon, along with a suitable background diluent gas, such as but not limited to helium. The pre-treatment plasma 23 is preferably employed at: (1) a reactor chamber pressure of about 100 to about 1000 mtorr; (2) a radio frequency power of about 200 to about 1500 watts at a radio frequency of 13.56 MHZ; (3) a substrate temperature of from about −20 to about 25 degrees centigrade; and (4) a total plasma pre-treatment gas composition flow of from about 100 to about 900 standard cubic centimeters per minute (sccm) which include a carbon tetrafluoride gas flow of from about 5 to about 100 standard cubic centimeters per minute (sccm), an argon gas flow of from about 100 to about 800 standard cubic centimeters per minute (sccm) and a helium background gas pressure of from about zero to about 25 torr. Preferably, the patterned photoresist layer 20a and the exposed portions of the blanket focusing layer 20 are pre-treated and stabilized by exposure to the pre-treatment plasma 23 for a time period of from about 15 to about 90 seconds.

Figure 4:
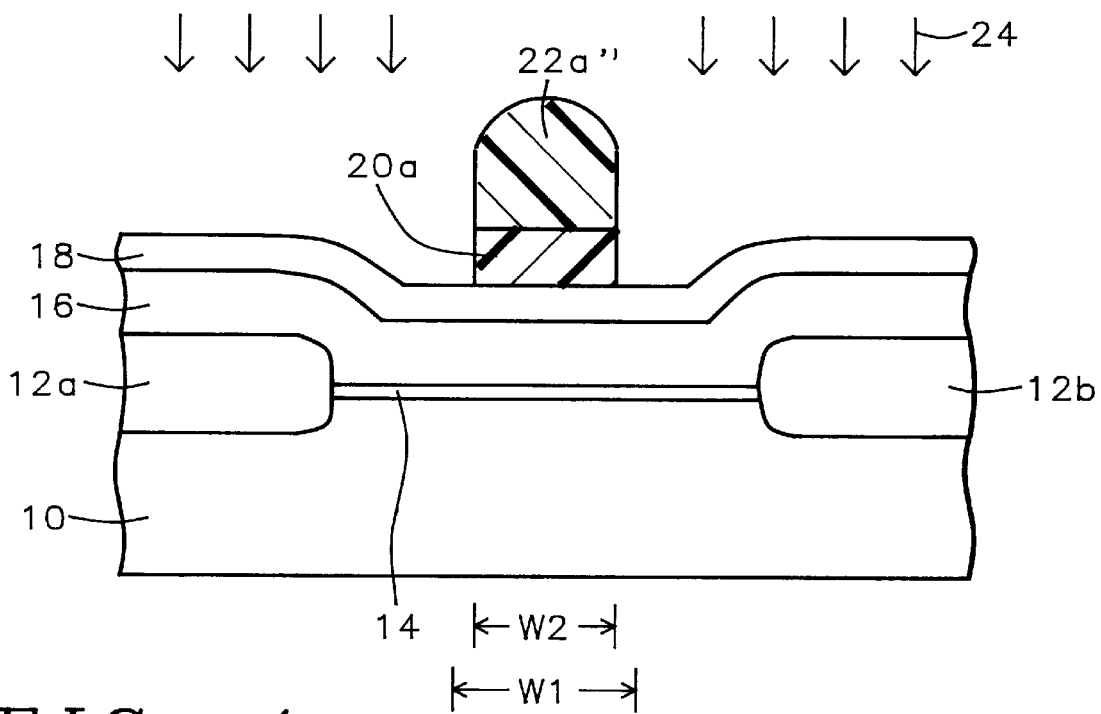

Referring now to FIG. 4 there is shown a schematic cross-sectional diagram illustrating the results of further processing of the integrated circuit whose schematic cross-sectional diagram is illustrated in FIG. 3. Shown in FIG. 4 is the results of patterning through a first etch method employing a first plasma 24 the pre-treated blanket focusing layer 20' to form a patterned focusing layer 20a. As is illustrated in FIG. 4, the patterned focusing layer 20a has a linewidth W2 less than the linewidth W1 of the pre-treated patterned photoresist layer 22a' as illustrated in FIG. 3. For the preferred embodiment of the method of the present invention, the patterned focusing layer 20a exhibits the linewidth W2 less than the linewidth W1 of the pre-treated patterned photoresist layer 22a' by means of a simultaneous co-etching of the pre-treated patterned photoresist layer 22a' to form an etched patterned photoresist layer 22a", along with the patterned focusing layer 20a, when patterning the patterned focusing layer 20a from the pre-treated blanket focusing layer 20'. Within the preferred embodiment of the method of the present invention the etched patterned photoresist layer 22a" and the patterned focusing layer 20a will typically and preferably be of the same linewidth W2, although within the general embodiment of the method of the present invention an equivalence of the linewidth of the etched patterned photoresist layer 22a" and the patterned focusing layer 20a is not required. Thus, although it is not specifically illustrated within FIG. 4, it is also possible within the method of the present invention that the patterned focusing layer 20a may be undercut with respect to the etched patterned photoresist layer 22a".

Within the preferred embodiment of the method of the present invention, it has been found experimentally that the first etch method through which the patterned focusing layer 20a is formed from the pre-treated blanket focusing layer 20' while employing the pretreated patterned photoresist layer 22a' as a first etch mask layer is a first plasma etch method employing the first plasma 24 which in turn employs an etchant gas composition comprising carbon tetrafluoride and argon without oxygen, preferably also with trifluoromethane. It is believed that the trifluoromethane and the carbon tetrafluoride components of the etchant gas composition provide for smooth sidewall etching of the patterned focusing layer 20a from the pre-treated blanket focusing layer 20' when forming the patterned focusing layer 20a from the pre-treated blanket focusing layer 20' through the first plasma etch method. Since higher wafer temperatures tend to assist in etching polymers isotropically when etching polymers within plasma etch methods, the wafer temperature is an additional sensitive parameter for controlling critical dimension (CD) when etching the patterned focusing layer 20a from the pre-treated blanket focusing layer 20'.

Preferably the first plasma etch method employs a: (1) a reactor chamber pressure of from about 100 to about 500 mtorr; (2) a radio frequency power of from about 200 to about 1500 watts at a radio frequency of 13.56 MHZ; (3) a substrate temperature of from about −20 to about 25 degrees centigrade; and (4) a total etchant gas composition flow of from about 100 to about 900 standard cubic centimeters per minute (sccm), where the individual etchant gas flows are trifluoromethane at about zero to about 50 standard cubic centimeters per minute (sccm), carbon tetrafluoride at about 5 to about 100 standard cubic centimeters per minute (sccm), argon at about 100 to about 800 standard cubic centimeters per minute (sccm), and a helium background gas at about zero to about 25 torr. In order to provide optimal etching of the patterned focusing layer 20a from the pre-treated blanket focusing layer 20', it has also been found experimentally that the patterned focusing layer 20a is etched from the pre-treated blanket focusing layer 20' for a time period which includes an over-etch of from about 10 to about 50 percent with respect to an endpoint which may be determined through endpoint detection methods including but not limited to optical endpoint detection methods and residual gas analysis (RGA) endpoint detection methods as are known in the art. Under these conditions for the first etch method, the linewidth W2 for the patterned focusing layer 20a will typically and preferably have a negative etch bias with respect to the pre-treated patterned photoresist layer 22a' of at least about −0.15 microns, thus yielding a linewidth W2 for the patterned focusing layer 20a at least as narrow as about 0.25 microns. More typically and preferably, the linewidth W2 of the patterned focusing layer 20a will have an etch bias with respect to the patterned photoresist layer 22a of from about +0.02 to about −0.15 microns.

Figure 5:
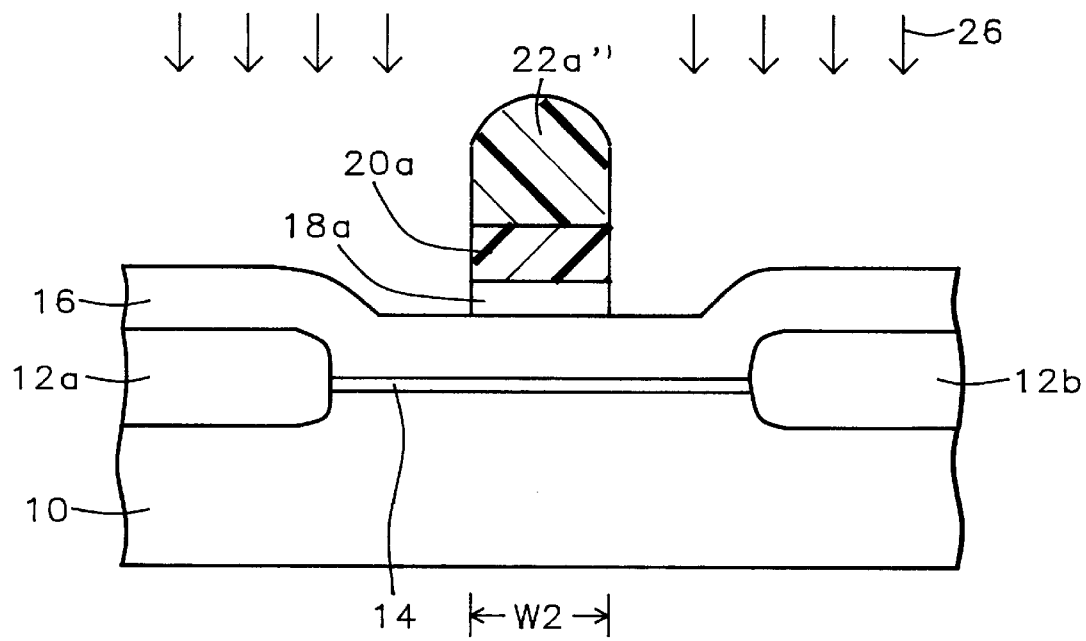

Referring now to FIG. 5 there is shown a schematic cross-sectional diagram illustrating the results of further processing of the integrated circuit whose schematic cross-sectional diagram is illustrated in FIG. 4. Shown in FIG. 5 is the results of patterning through a second etch method while employing a second plasma 26 the blanket conformal dielectric layer 18 to form a patterned conformal dielectric layer 18a. Within the preferred embodiment of the method of the present invention, the presence and patterning of the blanket conformal dielectric layer 18 to form the patterned conformal dielectric layer 18a serves to provide optimal resolution and minimal linewidth of patterned layers subsequently formed beneath the patterned conformal dielectric layer 18a. The optimal resolution and minimal linewidth of patterned layers subsequently formed beneath the patterned conformal dielectric layer 18a may, due to the presence of the patterned conformal dielectric layer 18a, be effected even in the presence of deterioration of the etched patterned photoresist layer 22a" and/or the patterned focusing layer 20a. Thus, although it is understood by a person skilled in the art that performance of the method of the present invention is optimized when employing the blanket conformal dielectric layer 18 to form the patterned conformal dielectric layer 18a, the blanket conformal dielectric layer 18 is optional within the integrated circuit whose schematic cross-sectional diagram is illustrated in FIG. 1 to FIG. 4. Without the blanket conformal dielectric layer 18 the present invention still provides an operable, although not optimal, method.

Within the preferred embodiment of the method of the present invention, it has been found experimentally that the second etch method through which the patterned conformal dielectric layer 18a is formed from the blanket conformal dielectric layer 18 while employing the etched patterned photoresist layer 22a" and the patterned focusing layer 20a as a second etch mask layer is a second plasma etch method employing the second plasma 26. The second plasma 26, in turn, preferably employs an etchant gas composition comprising trifluoromethane, carbon tetrafluoride and argon. Preferably the second plasma etch method employs a: (1) a reactor chamber pressure of from about 100 to about 500 mtorr; (2) a radio frequency power of from about 200 to about 1500 watts at a radio frequency of 13.56 MHZ; (3) a substrate temperature of from about −20 to about 25 degrees centigrade; and (4) a total etchant gas composition flow of from about 100 to about 900 standard cubic centimeters per minute (sccm), where the individual gas flows are trifluoromethane at about zero to about 50 standard cubic centimeters per minute (sccm), carbon tetrafluoride at about 5 to about 100 standard cubic centimeters per minute (sccm), argon at about 100 to about 800 standard cubic centimeters per minute (sccm), and a helium background gas at about zero to about 25 mtorr. In order to provide optimal etching of the patterned conformal dielectric layer 18a from the blanket conformal dielectric layer 18, it has also been found experimentally that the patterned conformal dielectric layer 18a is preferably etched from the blanket conformal dielectric layer 18 for a time period which includes an over-etch of from about 10 to about 50 percent with respect to an endpoint which may be determined through endpoint detection methods including but not limited to optical endpoint detection methods and residual gas analysis (RGA) endpoint detection methods as are known in the art. Under these conditions for the second etch method, the linewidth for the patterned conformal dielectric layer 18a will typically coincide with the linewidth W2 for the patterned focusing layer 20a, thus yielding a linewidth W2 for the patterned conformal dielectric layer 18a at least as narrow as about 0.25 microns.

Figure 6:
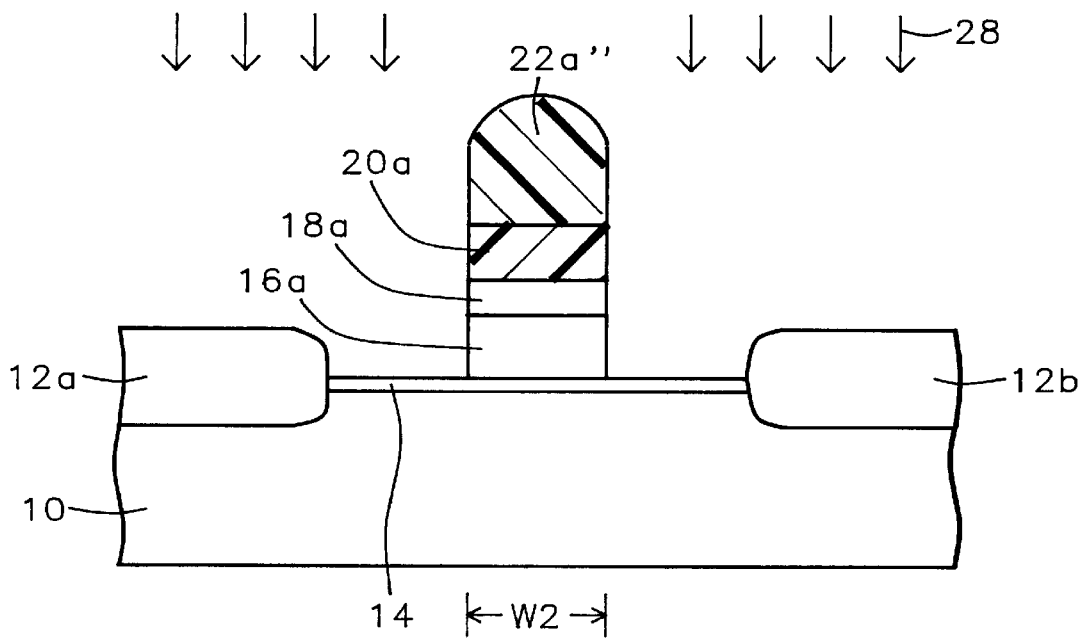

Referring now to FIG. 6, there is shown a schematic cross-sectional diagram illustrating the results of further processing of the integrated circuit whose schematic cross-sectional diagram is illustrated in FIG. 5. Shown in FIG. 6 is the results of patterning, while employing the etched patterned photoresist layer 22a", the patterned focusing layer 20a, and the patterned conformal dielectric layer 18a as a third etch mask layer, the blanket gate electrode material layer 16 to form a gate electrode 16a through a third etch method employing a third plasma 28. As is understood by a person skilled in the art, when the blanket gate electrode material layer 16 is formed of polysilicon or a polycide, the gate electrode 16a is typically and preferably patterned from the blanket gate electrode material layer 16 through the third plasma 28, where the third plasma 28 preferably comprises a chlorine containing etchant gas composition. Following patterning of the gate electrode 16a from the blanket gate electrode material layer 16, there is typically also patterned a gate dielectric layer (not shown) from the blanket gate dielectric layer 14 through a fourth etch method employing a fourth plasma (also not shown). Typically and preferably, the fourth plasma comprises a fluorine containing etchant gas composition.

As is understood by a person skilled in the art, for optimal performance of the method of the present invention, while each of the second etch method, the third etch method and the fourth etch method individually has a reproducible second etch bias, a reproducible third etch bias and a reproducible fourth etch bias, the aggregate of the second etch bias, the third etch bias and the fourth etch bias does not substantially compensate for the reproducible negative etch bias of the patterned focusing layer 20a with respect to the patterned photoresist layer 22a. Preferably, the second etch method has a reproducible second etch bias, the third etch method has a reproducible third etch bias and the fourth etch method has a reproducible fourth etch bias, where the reproducible second etch bias, the reproducible third etch bias and the reproducible fourth etch bias are each approximately zero (ie: from about 0.03 to about −0.03 microns).

Figure 7:
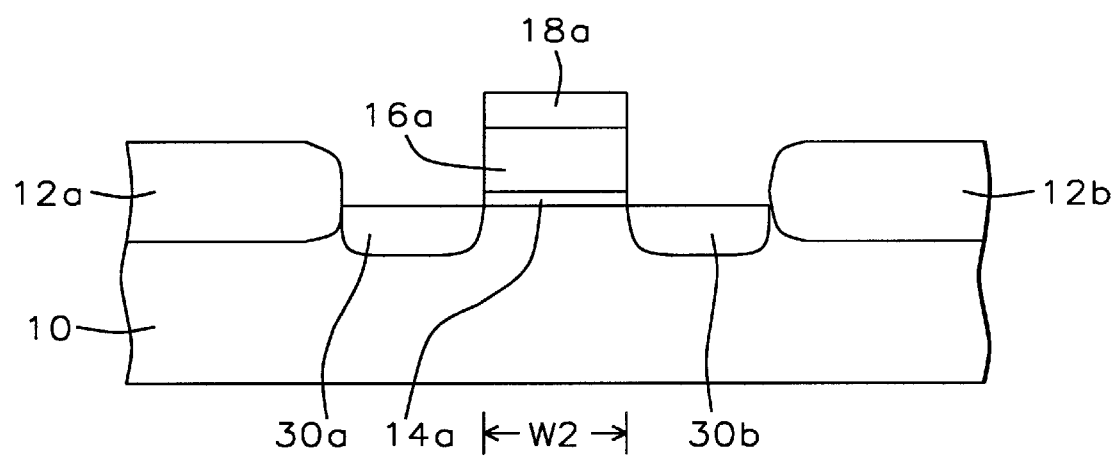

Referring now to FIG. 7, there is shown a schematic cross-sectional diagram illustrating the results of further processing of the integrated circuit whose schematic cross-sectional diagram is illustrated in FIG. 6. Shown in FIG. 7 is a schematic cross-sectional diagram of an integrated circuit largely equivalent to the integrated circuit whose schematic cross-sectional diagram is illustrated in FIG. 6 but within which there is illustrated the gate dielectric layer 14a which is formed from patterning of the blanket gate dielectric layer 14 through the fourth etch method. In addition, there has been removed from the integrated circuit whose schematic cross-sectional diagram is illustrated in FIG. 6 the etched patterned photoresist layer 22a" and the patterned focusing layer 20a from the patterned conformal dielectric layer 18a. Methods through which layers such as the etched patterned photoresist layer 22a" and the patterned focusing layer 20a may be removed from integrated circuits are known in the art of integrated circuit fabrication. Methods through which layers such as the etched patterned photoresist layer 22a" and the patterned focusing layer 20a may be removed from integrated circuits typically include methods including but not limited to oxygen plasma stripping methods. Since within the preferred embodiment of the method of the present invention both the etched patterned photoresist layer 22a" and the patterned focusing layer 20a are formed of organic materials, they are both preferably sequentially stripped from the patterned conformal dielectric layer 18a and the gate electrode 16a through an oxygen plasma stripping method as is known in the art of integrated circuit fabrication.

Finally, there is shown in FIG. 7 the presence of a pair of source/drain regions 30a and 30b formed into the active region of the semiconductor substrate 10 at areas not occupied by the gate dielectric layer 14a, the gate electrode 16a and the patterned conformal dielectric layer 18a, thus forming within and upon the semiconductor substrate 10 a field effect transistor (FET). Methods and materials through which source/drain regions may be formed within field effect transistors (FETs) for use within integrated circuits are known within the art of integrated circuit fabrication. Source/drain regions are typically formed within field effect transistors (FETs) through ion implantation methods employing a dopant ion of suitable polarity to the field effect transistor (FET) desired to be formed. For the preferred embodiment of the method of the present invention, the source/drain regions 30a and 30b are preferably formed through ion implanting a suitable dopant into the active region of the semiconductor substrate 10, while employing the gate oxide layer 14a, the gate electrode 16a and the patterned conformal dielectric layer 18a as a mask, at an ion implantation dose of from about 1E14 to about 1E16 ions per square centimeter and an ion implantation energy of from about 10 to about 50 keV.

Upon forming the source/drain regions 30a and 30b, there is formed an integrated circuit having formed therein a field effect transistor (FET), where the gate electrode of the field effect transistor (FET) is formed with a uniform linewidth dimension at least as narrow as about 0.25 microns, while employing a near ultra-violet (NUV) (ie: 365 nm) photoexposure radiation method in forming the gate electrode within the field effect transistor (FET).

EXAMPLES

Upon each semiconductor substrate within a pair of eight inch diameter semiconductor substrates was formed a blanket gate electrode material layer formed of a tungsten silicide polycide through a method as is conventional in the art. The blanket layers of gate electrode material formed of the tungsten silicide polycide were about 1000 angstroms thick each. Upon each blanket gate electrode material layer formed of the tungsten silicide polycide was then formed a blanket conformal dielectric layer of a silicon oxide deposited through an otherwise conventional plasma enhanced chemical vapor deposition (PECVD) method employing tetra-ethyl-ortho-silicate (TEOS) as a silicon source material. The blanket conformal dielectric layers of silicon oxide so formed were about 2000 angstroms thick each. Formed then upon the blanket conformal dielectric layers were blanket focusing layers formed of an organic anti-reflective coating (ARC) material obtained from Brewer Science Inc., Rolla, Mo. as product ARC XRHi-11. The blanket focusing layers so formed were about 1500 angstroms thick each after thermal curing at a temperature of about 175 degrees centigrade. Finally, there was formed upon each of the blanket focusing layers a blanket photoresist layer formed of a novolak positive photoresist material available from Sumitomo Co., Japan as PFI-38 photoresist material. The blanket photoresist layers of the novolak positive photoresist material so formed were about 9000 angstroms thick each.

The blanket photoresist layers upon the blanket focusing layers were then photoexposed employing a near ultra-violet (NUV) (ie: 365 nm) photoexposure radiation method and developed through methods as are conventional in the art to yield upon each semiconductor substrate a series of patterned photoresist lines formed upon the blanket focusing layer. Each line within the series of patterned photoresist lines formed upon each blanket focusing layer was of nominal linewidth about 0.35 microns. Each line was separated from an adjoining line by a nominal pitch of about 0.35 microns. The actual linewidths of the patterned photoresist lines upon the two blanket focusing layers were measured employing a scanning electron microscopic technique. The measured values for the actual linewidths of the two series of patterned photoresist lines are reported in TABLE I as P/R (photoresist) ADI (after development inspection) measurement values.

The patterned photoresist layer and the exposed portions of the blanket focusing layer of the anti-reflective coating (ARC) material formed upon one of the two semiconductor substrates were then pre-treated and stabilized through exposure to a plasma pre-treatment method employing a plasma pre-treatment gas composition comprising carbon tetrafluoride and argon without oxygen. The pre-treatment plasma was employed at: (1) a reactor chamber pressure of about 1000 mtorr; (2) a radio frequency power of about 1200 watts at a radio frequency of 13.56 MHZ; (3) a substrate temperature of about zero degrees centigrade; and (4) a total plasma pre-treatment gas composition flow of about 700 standard cubic centimeters per minute (sccm) which included a carbon tetrafluoride gas flow of about 50 standard cubic centimeters per minute (sccm), an argon gas flow of about 650 standard cubic centimeters per minute (sccm) and a helium background gas pressure of about 10 torr. The patterned photoresist lines and the portions of the blanket focusing layer were pre-treated and stabilized by exposure to the pre-treatment plasma for a time period of about 30 seconds. The patterned photoresist lines and the exposed portions of the blanket focusing layer upon the other semiconductor substrate received no plasma pre-treatment.

The two semiconductor substrates were reunited and either the blanket focusing layer or the pre-treated blanket focusing layer was then etched to form a patterned focusing layer while employing the corresponding patterned photoresist lines or pre-treated patterend photoresist lines as a first etch mask layer, through a first etch method employing a first plasma at: (1) a reactor chamber pressure of about 380 mtorr; (2) a radio frequency power of about 1200 watts at a radio frequency of 13.56 MHZ; (3) a substrate temperature of about zero degrees centigrade; (4) a trifluoromethane flow rate of about 20 standard cubic centimeters per minute (sccm); (5) a carbon tetrafluoride flow rate of about 30 standard cubic centimeters per minute (sccm); and (6) an argon flow rate of about 350 standard cubic centimeters per minute (sccm). The blanket focusing layer or the pre-treated blanket focusing layer was etched to an endpoint detected through an optical emission method for a main etch time of about 45 seconds for the blanket focusing layer and about 45 seconds for the pre-treated blanket focusing layer, plus an over-etch of about 30 percent for an over-etch time of about 15 seconds.

The exposed portions of the blanket conformal dielectric layers formed upon the two semiconductor substrates were then etched through a second etch method employing a second plasma at: (1) a reactor chamber pressure of about 380 mtorr; (2) a radio frequency power of about 1200 watts at a radio frequency of 13.56 MHZ; (3) a substrate temperature of about zero degrees centigrade; (4) a trifluoromethane flow rate of about 30 standard cubic centimeters per minute (sccm); (5) a carbon tetrafluoride flow rate of about 12 standard cubic centimeters per minute (sccm); and (6) an argon flow rate of about 350 standard cubic centimeters per minute (sccm). The blanket conformal dielectric layers were etched to an endpoint detected through an optical emission method at a time of about 55 seconds, plus an additional over-etch of about 30 percent for about 17 seconds.

The exposed portions of the two blanket gate electrode material layers formed of the tungsten silicide polycide upon each of the two semiconductor substrates were then etched through a third etch method employing a third plasma at: (1) a reactor chamber pressure of about 10 mtorr; (2) a radio frequency power of about 500 watts at a radio frequency of 13.56 MHZ; (3) a substrate temperature of about zero degrees centigrade; (4) a chlorine flow rate of about 100 standard cubic centimeters per minute; and (5) a hydrogen bromide gas flow rate of about 100 standard cubic centimeters per minute, for a time period of about 30 seconds, which included about 100 percent over-etch.

The remaining etched patterned photoresist lines and the remaining patterned focusing layers were then removed completely from the two semiconductor substrates through an oxygen plasma stripping method employing an oxygen plasma reactor at: (1) a reactor chamber pressure of about 4000 mtorr; (2) a radio frequency power of about 600 watts at a radio frequency of 13.56 MHZ; (3) a substrate temperature of about 250 degrees centigrade; and (4) an oxygen flow rate of about 1000 standard cubic centimeters per minute (sccm).

The remaining series of patterned conformal dielectric layers aligned upon the patterned gate electrode material layers formed upon the two semiconductor substrates were then stripped through immersion in a 100:1 dilute hydrofluoric acid (DHF) solution for a time period of about 15 seconds, followed by deionized water rinsing and spin drying through methods as are conventional in the art.

The linewidths of the remaining two series of patterned lines within the patterned gate electrode material layers formed from the tungsten silicide polycide exposed upon the two semiconductor substrates were then measured through the same method and at the same locations as employed in measuring the linewidths of the two series of patterned photoresist lines upon the two semiconductor substrates. The linewidth measurements of the two series of tungsten silicide polycide lines are reported in TABLE I as polycide AEI (after etch inspection) measurement values. There is also reported in TABLE I the etch bias which is calculated as the polycide AEI (after etch inspection) measurement values minus the corresponding photoresist ADI (after development inspection) measurement values.

TABLE I

| Expl. | Pre-Trtmt | P/R ADI (microns) | Polycide AEI (microns) | Etch Bias (microns) |
|---|---|---|---|---|
| 1 | yes | 0.410 +/- 0.020 | 0.265 +/- 0.015 | 0.145 +/- 0.035 |
| 2 | no | 0.400 +/- 0.040 | 0.390 +/- 0.020 | 0.010 +/- 0.040 |

From review of the data in Table I it is seen that through the blanket focusing layer etch method and patterned photoresist layer pre-treatment plasma method of the present invention there may be formed when employing a patterned photoresist layer having a nominal linewidth as narrow as about 0.35 microns (as formed through a near ultra-violet (NUV) (ie: 365 nm) photoexposure radiation method) a corresponding patterned polycide line of uniform linewidth dimension at least as narrow as about 0.25 microns. In particular, it is also seen that the relative uniformity of the patterned polycide line formed through the plasma pre-treatment method of the present invention is greater than a patterned polycide line formed through an otherwise equivalent plasma etch method absent the plasma pre-treatment step of the plasma pre-treatment method of the present invention. Thus, through the method of the present invention there may be formed within integrated circuits electrical circuit elements and patterned layers of uniform linewidth dimensions at least as narrow as about 0.25 microns, while employing near ultra-violet (NUV) (ie: 365 nm) photoexposure radiation rather than deep ultra-violet (DUV) (ie: 248 nm) photoexposure radiation or x-ray photoexposure radiation.

As is understood by a person skilled in the art, the preferred embodiment and examples of the present invention are illustrative of the present invention rather than limiting of the present invention. Revisions and modifications may be made to methods, materials, structures and dimensions through which is provided the preferred embodiment and examples of the present invention while still providing embodiments and examples which are within the spirit and scope of the present invention, as defined by the appended claims.

What is claimed is:

1. A method for forming a patterned layer within an integrated circuit comprising:

providing a substrate;

forming upon the substrate a blanket target layer;

forming upon the blanket target layer a blanket focusing layer, the blanket focusing layer being formed from an organic polymer anti-reflective coating (ARC) material, the blanket focusing layer being susceptible to a reproducible negative etch bias within a first etch method employed in forming from the blanket focusing layer a patterned focusing layer, the first etch method being a first plasma etch method employing a reactant gas composition comprising carbon tetrafluoride and argon without oxygen;

forming upon the blanket focusing layer a blanket photoresist layer;

photoexposing and developing the blanket photoresist layer to form a patterned photoresist layer;

pre-treating and stabilizing through a plasma pre-treatment method the patterned photoresist layer to form a pre-treated patterned photoresist layer, the plasma pre-treatment method employing a plasma pre-treatment gas composition comprising carbon tetrafluoride and argon without oxygen;

etching through the first etch method the blanket focusing layer to form the patterned focusing layer while employing the pre-treated patterned photoresist layer as a first etch mask layer, the patterned focusing layer having the reproducible negative etch bias with respect to the patterned photoresist layer; and etching through a second etch method the blanket target layer to form a patterned target layer while employing the patterned focusing layer as a second etch mask layer, the patterned target layer having a reproducible second etch bias with respect to the patterned focusing layer.

2. The method of claim 1 wherein:

the blanket target layer is chosen from a group of blanket target layers consisting of blanket conductor layers, blanket insulator layers, blanket semiconductor layers and blanket photoactive layers; and the blanket target layer is from 1000 to 20000 angstroms thick.

3. The method of claim 1 wherein the blanket focusing layer is from 750 to 2500 angstroms thick.

4. The method of claim 1 wherein the blanket photoresist layer is photoexposed employing a near ultra-violet (NUV) (ie: 365 nm) photoexposure radiation method and developed to yield the patterned photoresist layer of linewidth dimension as low as 0.25 microns.

5. A method for forming a patterned layer within an integrated circuit comprising:

providing a substrate;

forming upon the substrate a blanket target layer;

forming upon the blanket target layer a blanket conformal dielectric layer;

forming upon the blanket conformal dielectric layer a blanket focusing layer, the blanket focusing layer being formed from an organic polymer anti-reflective coating (ARC) material, the blanket focusing layer being susceptible to a reproducible negative etch bias within a first etch method employed in forming from the blanket focusing layer a patterned focusing layer, the first etch method being a first plasma etch method employing a reactant gas composition comprising carbon tetrafluoride and argon without oxygen;

forming upon the blanket focusing layer a blanket photoresist layer;

photoexposing and developing the blanket photoresist layer to form a patterned photoresist layer;

pre-treating and stabilizing through a plasma pre-treatment method the patterned photoresist layer to form a pre-treated patterned photoresist layer, the plasma pre-treatment method employing a plasma pre-treatment gas composition comprising carbon tetrafluoride and argon without oxygen;

etching through the first etch method the blanket focusing layer to form the patterned focusing layer while employing the pre-treated patterned photoresist layer as a first etch mask layer, the patterned focusing layer having the reproducible negative etch bias with respect to the patterned photoresist layer;

etching through a second etch method the blanket conformal dielectric layer to form a patterned conformal dielectric layer while employing the patterned focusing layer as a second etch mask layer, the patterned conformal dielectric having a reproducible second etch bias with respect to the patterned focusing layer; and etching through a third etch method the blanket target layer to form a patterned target layer while employing the patterned conformal dielectric layer as a third etch mask layer, the patterned target layer having a reproducible third etch bias with respect to the patterned conformal dielectric layer.

6. The method of claim 5 wherein:

the blanket target layer is chosen from a group of blanket target layers consisting of blanket conductor layers, blanket insulator layers, blanket semiconductor layers and blanket photoactive layers; and the blanket target layer is from 1000 to 20000 angstroms thick.

7. The method of claim 5 wherein the blanket conformal dielectric layer is from 300 to about angstroms thick.

8. The method of claim 5 wherein the blanket focusing layer is from 750 to 2500 angstroms thick.

9. The method of claim 5 wherein the blanket photoresist layer is photoexposed employing a near ultra-violet (NUV) (ie: 365 nm) photoexposure radiation method and developed to yield the patterned photoresist layer of linewidth dimension as low as 0.25 microns.

10. A method for forming a gate electrode within an integrated circuit comprising:

providing a substrate;

forming upon the substrate a blanket gate electrode material layer;

forming upon the blanket gate electrode material layer a blanket focusing layer, the blanket focusing layer being formed from an organic polymer anti-reflective coating (ARC) material, the blanket focusing layer being susceptible to a reproducible negative etch bias within a first etch method employed in forming from the blanket focusing layer a patterned focusing layer, the first etch method being a first plasma etch method employing a reactant gas composition comprising carbon tetrafluoride and argon without oxygen;

forming upon the blanket focusing layer a blanket photoresist layer;

photoexposing and developing the blanket photoresist layer to form a patterned photoresist layer;

pre-treating and stabilizing through a plasma pre-treatment method the patterned photoresist layer to form a pre-treated patterned photoresist layer, the plasma pre-treatment method employing a plasma pre-treatment gas composition comprising carbon tetrafluoride and argon without oxygen;

etching through the first etch method the blanket focusing layer to form the patterned focusing layer while employing the pre-treated patterned photoresist layer as a first etch mask layer, the patterned focusing layer having the reproducible negative etch bias with respect to the patterned photoresist layer; and etching through a second etch method the blanket gate electrode material layer to form a gate electrode while employing the patterned focusing layer as a second etch mask layer, the gate electrode having a reproducible second etch bias with respect to the patterned focusing layer.

11. The method of claim 10 wherein:

the blanket gate electrode material layer target layer is chosen from a group of blanket gate electrode material layers consisting of blanket polysilicon layers and blanket polycide layers; and the blanket gate electrode material layer is from 1000 to 3000 angstroms thick.

12. The method of claim 10 wherein the blanket focusing layer is from 750 to 2500 angstroms thick.

13. The method of claim 10 wherein the blanket photoresist layer is photoexposed employing a near ultra-violet (NUV) (ie: 365 nm) photoexposure radiation method and developed to yield the patterned photoresist layer of linewidth dimension as low as 0.25 microns.

14. A method for forming a gate electrode layer within an integrated circuit comprising:

providing a substrate;

forming upon the substrate a blanket gate electrode material layer;

forming upon the blanket gate electrode material layer a blanket conformal dielectric layer;

forming upon the blanket conformal dielectric layer a blanket focusing layer, the blanket focusing layer being formed from an organic polymer anti-reflective coating (ARC) material, the blanket focusing layer being susceptible to a reproducible negative etch bias within a first etch method employed in forming from the blanket focusing layer a patterned focusing layer, the first etch method being a first plasma etch method employing a reactant gas composition comprising carbon tetrafluoride and argon without oxygen;

forming upon the blanket focusing layer a blanket photoresist layer;

photoexposing and developing the blanket photoresist layer to form a patterned photoresist layer;

pre-treating and stabilizing through a plasma pre-treatment method the patterned photoresist layer to form a pre-treated patterned photoresist layer, the plasma pre-treatment method employing a plasma pre-treatment gas composition comprising carbon tetrafluoride and argon without oxygen;

etching through the first etch method the blanket focusing layer to form the patterned focusing layer while employing the pre-treated patterned photoresist layer as a first etch mask layer, the patterned focusing layer having the reproducible negative etch bias with respect to the patterned photoresist layer;

etching through a second etch method the blanket conformal dielectric layer to form a patterned conformal dielectric layer while employing the patterned focusing layer as a second etch mask layer, the patterned conformal dielectric having a reproducible second etch bias with respect to the patterned focusing layer; and etching through a third etch method the blanket gate electrode material layer to form a gate electrode while employing the patterned conformal dielectric layer as a third etch mask layer, the gate electrode having a reproducible third etch bias with respect to the patterned conformal dielectric layer.

15. The method of claim 14 wherein:

the blanket gate electrode material layer is chosen from a group of blanket gate electrode material layers consisting of blanket polysilicon layers and blanket polycide layers; and the blanket gate electrode material layer is from 1000 to 3000 angstroms thick.

16. The method of claim 14 wherein the blanket conformal dielectric layer is from 300 to 2500 angstroms thick.

17. The method of claim 14 wherein the blanket focusing layer is from 750 to 2500 angstroms thick.

18. The method of claim 14 wherein the blanket photoresist layer is photoexposed employing a near ultra-violet (NUV) (ie: 365 nm) photoexposure radiation method and developed to yield the patterned photoresist layer of linewidth dimension as low as 0.25 microns.

* * * * *